US006710987B2

(12) United States Patent
Sun et al.

(10) Patent No.: US 6,710,987 B2
(45) Date of Patent: Mar. 23, 2004

(54) MAGNETIC TUNNEL JUNCTION READ HEAD DEVICES HAVING A TUNNELING BARRIER FORMED BY MULTI-LAYER, MULTI-OXIDATION PROCESSES

(75) Inventors: Jijun Sun, Saku (JP); Satoru Araki, Saku (JP)

(73) Assignee: TDK Corporation, Tokyo (JP)

( * ) Notice: Subject to any disclaimer, the term of this patent is extended or adjusted under 35 U.S.C. 154(b) by 202 days.

(21) Appl. No.: 09/903,697

(22) Filed: Jul. 13, 2001

(65) Prior Publication Data

US 2002/0097534 A1 Jul. 25, 2002

Related U.S. Application Data

(60) Provisional application No. 60/249,266, filed on Nov. 17, 2000.

(51) Int. Cl.⁷ .................................................. G11B 5/39
(52) U.S. Cl. ................................................ 360/324.2
(58) Field of Search ........................ 360/324.2; 365/158, 365/171, 173; 338/32 R; 257/421

(56) References Cited

U.S. PATENT DOCUMENTS

| 5,159,513 A |    | 10/1992 | Dieny et al. |
|---|---|---|---|
| 5,729,410 A |    | 3/1998 | Fontana, Jr. et al. |
| 5,862,022 A | * | 1/1999 | Noguchi et al. .......... 360/324.2 |
| 6,359,289 B1 | * | 3/2002 | Parkin ......................... 257/43 |
| 6,452,204 B1 | * | 9/2002 | Ishiwata et al. ................ 257/9 |
| 6,542,342 B1 | * | 4/2003 | Hayashi et al. .......... 360/324.2 |

OTHER PUBLICATIONS

J.S. Moodera et al., "Large Magnetoresistance at Room Temperature in Ferromagnetic Thin Film Tunnel Junctions", Physical Review Letters, vol. 74, No. 16, Apr. 17, 1995, pp. 3273–3276.

S.S.P. Parkin et al., "Exchange–Biased Magnetic Tunnel Junctions and Application to Nonvolatile Magnetic Random Access Memory (invited)", J. Appl. Phys., vol. 85, No. 8, Apr. 15, 1999, pp. 5828–5833.

M. Julliere, "Tunneling Between Ferromagnetic Films", Physics Letters, vol. 54A, No. 3, Sep. 8, 1975, pp. 225–226.

S. Maekawa et al., "Electron Tunneling Between Ferromagnetic Films", IEEE Transactions on Magnetics, vol. MAG–18, No. 2, Mar. 1982, pp. 707–708.

H. Tsuge et al., "Magnetic Tunnel Junctions With In Situ Naturally–Oxidized Tunnel Barrier", Appl. Phys. Lett. 71 (22), Dec. 1, 1997, pp. 3296–3298.

U.S. patent application No. 09/621,003 filed on Jul. 20, 2000, entitled, "Magnetic Tunnel Junction Read Head Using a Hybrid, Low–Magnetization Flux Guide" to Oliver Redon et al.

* cited by examiner

Primary Examiner—David L. Ometz
(74) Attorney, Agent, or Firm—Morgan, Lewis & Bockius LLP

(57) ABSTRACT

A magnetic tunnel junction device and method for making same is provided. A first ferromagnetic portion is provided. A barrier is provided on the first ferromagnetic portion. The barrier includes a first barrier portion on the first ferromagnetic portion. The first barrier portion is oxidized. After oxidizing, a second barrier portion is provided on the first barrier portion. The second barrier may be oxidized or annealed. A second ferromagnetic portion is provided on the barrier. The barrier of the resultant device has a reduced number of pinholes, minimizing the amount of the non-tunnel current, and an improved symmetry of electrical properties. This leads to advantages in performance characteristics and mass-production of the device.

12 Claims, 15 Drawing Sheets

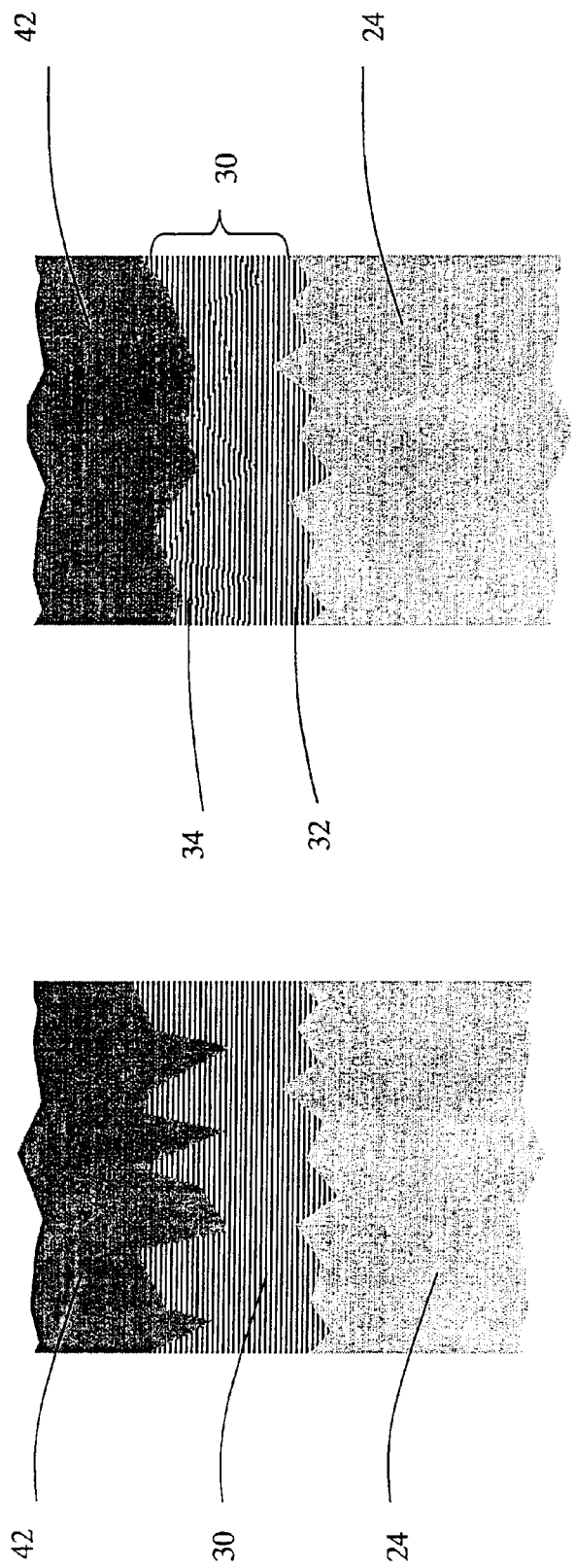

Oxidation process (I) according to present invention

Single oxidation process

MAGNETIC TUNNEL JUNCTION READ HEAD DEVICES HAVING A TUNNELING BARRIER FORMED BY MULTI-LAYER, MULTI-OXIDATION PROCESSES

This application claims the benefit of a provisional application, which was filed on Nov. 17, 2000 and assigned Provisional Application No. 60/249,266 filed on Nov. 17, 2000, which is hereby incorporated by reference.

BACKGROUND OF THE INVENTION

1. Field of Invention

The present invention relates generally to the art of magnetic tunnel junction (MTJ) read head devices, which sense magnetic fields in a magnetic recording medium. More particularly, the present invention relates to MTJ devices having tunneling barriers with improved magnetoresistance properties and improved symmetry of electrical properties. The invention finds particular application in conjunction with reading binary data from hard disk drives and will be described with particular reference thereto. However, it is to be appreciated that the invention will find application with other magnetic storage media. Further, it is to be appreciated that the invention will find application in other magnetic field detection devices as well as in other devices and environments.

2. Description of the Related Art

Magneto-resistive (MR) sensors based on anisotropic magneto-resistance (AMR) or a spin-valve (SV) effect are widely known and extensively used as read transducers to read magnetic recording media. Such MR sensors can probe the magnetic stray field coming out of transitions recorded on a recording medium by generating resistance changes in a reading portion formed of magnetic materials. AMR sensors have a low resistance change ratio or MR ratio $\Delta R/R$, typically from 1 to 3%, whereas SV sensors have a $\Delta R/R$ ranging from 2 to 7% for the same magnetic field excursion. SV heads showing such high sensitivity are able to achieve very high recording densities, that is, over several giga bits per square inch or Gbits/in$^2$.

In a basic SV sensor, two ferromagnetic layers are separated by a non-magnetic layer. An exchange or pinning layer of FeMn, for example, is further provided adjacent to one of the ferromagnetic layers. The exchange layer and the adjacent or fixed ferromagnetic layer are exchange-coupled so that the magnetic moment or magnetization direction of the ferromagnetic layer is strongly pinned or fixed in one direction. The magnetization direction of the other or free ferromagnetic layer is free to rotate in response to a small external magnetic field. When the magnetization directions of the ferromagnetic layers are changed from a parallel to an anti-parallel configuration, the sensor resistance increases yielding a relatively high MR ratio.

Another type of MR sensor, the MTJ, is based on tunneling magneto resistance (TMR). This was reported in Julliere, "Tunneling Between Ferromagnetic Films" *Physics Letters*, 54A 225 (1975), which is herein incorporated by reference. An MTJ comprises two ferromagnetic electrodes or layers separated by a thin insulating layer. An electrical bias is applied to the two electrodes to generate a sensing current. The insulating layer is thin enough so that electrons can tunnel through the insulating barrier to generate this current. One of the ferromagnetic layers has its magnetic moment fixed along one direction, i.e., the fixed or pinned layer, while the other layer, i.e., free or sensing layer, is free to rotate in an external magnetic field. MTJ sensors operate in current perpendicular to the plane (CPP) geometry, which means its sensing current flows in a thickness direction of a laminate film or orthogonal to the ferromagnetic layers.

The tunneling of the electrons through the insulating layer is a spin dependent process. In other words, the sensing or tunneling current through the junction depends on the spin-polarization state of the pinned and free ferromagnetic layers and the relative orientation of the magnetic moments (magnetization directions) of the two layers. The two ferromagnetic layers can have different responses to magnetic fields so that the relative orientation of their magnetization can be varied with an external magnetic field.

When the sense current experiences a first ferromagnetic layer, the electrons are spin polarized. If the magnetization directions of the two ferromagnetic layers are anti-parallel to each other, the probability of the electrons tunneling through the tunnel barrier is lowered, so that a high junction resistance $R_{ap}$ is obtained. On the other hand, if the magnetizations of the two ferromagnetic layers are parallel to each other, the probability of the electrons tunneling is increased and a high tunnel current and low junction resistance $R_p$ is obtained. In an intermediate state between the parallel and anti-parallel states, such as when the both ferromagnetic layers are perpendicular in magnetization to each other, a junction resistance $R_m$ between $R_{ap}$ and $R_p$ is obtained such that $R_{ap} > R_m > R_p$. Using these symbols, the TMR ratio may be defined as $\Delta R/R = (R_{ap} - R_p)/R_p$.

The relative magnetic direction orientation or angle of the two magnetic layers can be affected by an external magnetic field such as the transitions in a magnetic recording medium. This affects the MTJ resistance and thus the voltage of the sensing current or output voltage. By detecting the change in resistance and thus voltage based on the change in relative magnetization angle, changes in an external magnetic field are detected. In this manner, MTJ sensors are able to read magnetic recording media.

Prior to 1995, reported MTJs showed only low TMR response, on the order of 1–2%, at room temperature. MTJ began to show great promise for application to ultra-high density recordings when large TMR over 10% was first observed at room temperature. See Moodera et al, "Large magneto resistance at room temperature in ferromagnetic thin film tunnel junctions," *Phys. Rev. Lett.* v. 74, pp. 3273–3276 (1995), which is herein incorporated by reference.

Nevertheless, it has been difficult to make MTJ devices with large enough TMR response at room temperature to be useful. The large junction resistance is one of the main factors that limit application of MTJs as read heads because of the low signal to noise ratio (S/N). This factor is even more critical as the junction resistance is scaled up with decreasing junction size, which is required for high area density recording. On the other hand, low resistance junctions show small TMR response as reported by Tsuge and Mitsuzuka in "Magnetic Tunnel Junctions With In Situ Naturally-Oxidized Tunnel Barrier" *Appl. Phys. Lett.* 71, 3296 (1997), which is herein incorporated by reference.

Another problem that prevails in MTJ devices is shot noise, which lowers S/N. Shot noise is proportional to the junction resistance R and the square root of sensing current I. In order to have a high enough S/N, the junction resistance must be decreased. The junction resistance is exponentially proportional to an insulating barrier thickness d and the square root of a the barrier's energy gap or barrier height $\Phi$, i.e., $R \propto \exp(d\Phi^{1/2})$. By decreasing barrier thickness, junction resistance may be decreased. However, decreasing barrier thickness can cause or increase the effect of other problems discussed below.

For example, if the barrier thickness is too thin, it can contain pinholes. Pinholes generate a leak current through the barrier, decreasing resistance and S/N.

Another problem of conventional MTJs is an inhomogeneous tunneling barrier. After oxidation, a top oxide surface of an insulating barrier has a greater oxygen distribution than that at a bottom surface. This leads to asymmetric electrical properties with respect to signs of applied bias. Such asymmetry results in varying energy gaps or barrier heights across a thickness of the barrier.

A related problem associated with MTJ devices is electrostatic discharge (ESD). MTJ devices have a breakdown voltage, typically on the order of 150 V. If a device has asymmetric electrical properties, the breakdown voltage in one biased direction can be lower than in another biased direction. This can result in a lower breakdown voltage and destruction of the device due to ESD.

Another related problem is time dependence of dielectric breakdown (TDDB). Over time, the resistance of a barrier or dielectric can undesirably decrease. However, the more homogeneous the barrier, i.e., the more symmetric the electrical properties of a barrier, the more stable it is over time.

Yet another related problem is the yield of satisfactory MTJ devices during mass production. Typically, multiple MTJ devices are produced on one wafer. If barrier height and barrier width or thickness are inconsistent across the wafer, many of the MTJ devices produced will have unsatisfactory performance characteristics, such as head output and resistance, and will not pass quality control. Thus, it is desirable that the barrier is homogeneous and its electrical properties are symmetric. This will allow for a higher yield or greater ratio of satisfactory products over total products.

Therefore, a goal of the present invention is to provide a MTJ read head with low junction resistance and a high TMR ratio or response.

Another goal of the present invention is to provide a MTJ device with a tunneling barrier having symmetric electrical properties.

Still another goal of the invention is to provide a MTJ device that has higher performance characteristics in terms of ESD and TDDB.

Yet another goal of the invention is an MTJ device that may be mass produced with higher yields or fewer rejected devices.

SUMMARY OF THE INVENTION

Accordingly, the present invention is directed to a MTJ device and method for making same that substantially obviates one or more of the problems due to limitations and disadvantages of related art.

In accordance with one aspect of the invention, a method of manufacturing a MTJ device is disclosed. A first ferromagnetic portion is provided. A barrier is provided on the first ferromagnetic portion. The barrier is provided by providing a first barrier portion on the first ferromagnetic portion. The first barrier portion is oxidized. After oxidizing, a second barrier portion is provided on the first barrier portion. A second ferromagnetic portion is provided on the barrier.

In accordance with a more limited aspect of the invention, the second barrier portion is oxidized.

In another aspect of the invention, a magnetic tunnel junction device for detecting an applied magnetic field includes a first ferromagnetic layer. A tunnel barrier is on and contiguous with the first ferromagnetic layer. The barrier includes an oxidized first barrier layer and second barrier layer. A second ferromagnetic layer is on and contiguous with the barrier.

In more limited aspect of the invention, the second barrier layer is oxidized.

One advantage of the present invention is that it provides a MTJ with a reduced number of "pinholes" in the barrier, thus reducing the amount of non-tunnel current.

Another advantage is that it provides a MTJ with a relatively low junction resistance and high TMR ratio or response.

Yet another advantage is an improved symmetry of the electrical properties of the barrier in a MTJ.

Still another advantage is a MTJ device that may be mass produced with higher yields or fewer rejected devices.

Still further advantages of the present invention will become apparent to those of ordinary skill in the art upon reading and understanding the following detailed description of the preferred embodiments taken together with the accompanying figures.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

FIG. 3 is a schematic drawing of a tunneling barrier formed by a single oxidation process.

FIG. 4 is a schematic drawing of a tunneling barrier formed by a multiple oxidation process in which a first metallic or non-metallic layer is deposited onto a ferromagnetic layer, oxidized, then a second metallic or non-metallic layer is deposited thereon, and oxidized (oxidation process I).

DETAILED DESCRIPTION OF THE PREFERRED EMBODIMENTS

Reference will now be made in detail to the preferred embodiments of the present invention, examples of which are illustrated in the accompanying drawings.

Figure 1A:
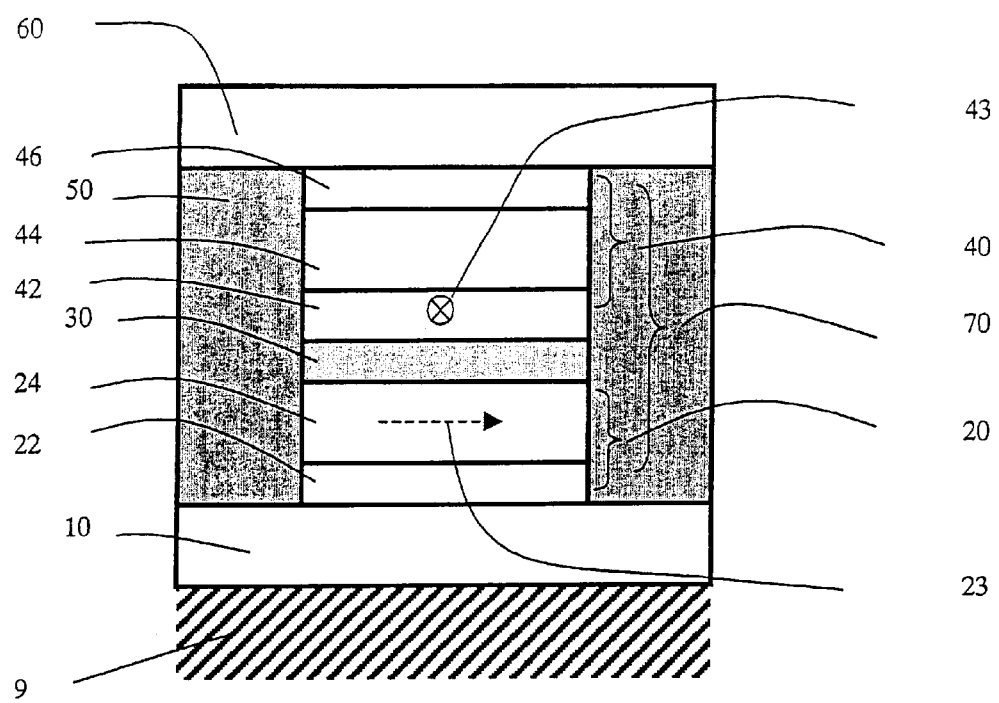
FIGS. 1A–1B show a cross-sectional view and a cut-away top view, respectively, of a MTJ device having a fixed ferromagnetic layer on top of a tunneling barrier of the present invention.

With reference to FIG. 1A, an MTJ device suitable for a magnetic field sensor application includes an MTJ 70 having a base electrode stack 20, an insulating tunnel portion or barrier 30, and a top electrode stack 40. The insulating barrier is described in greater detail below after a discussion of the other elements of the MTJ device.

A substrate 9 has formed thereon a bottom electrical lead 10, which is made up of electrically conductive materials. An MTJ is formed on top of the bottom electrical lead. Surrounding the MTJ is an oxide insulating barrier 50. A top wiring layer or lead 60, which is formed of electrically conductive materials, contacts the top of the MTJ and serves as an electrical lead. Preferably, the top and bottom electrical leads include one or more of Cu, Al and NiFe alloys. Each of the base and top electrode stacks 20, 40 has a ferromagnetic portion or layer contiguous or in contact with a tunneling barrier 30. The base electrode stack 20 is formed on top of bottom lead 10, and includes a seed layer 22 and a free ferromagnetic layer 24. Preferably, the seed layer includes one or more of Ta, Cr, Ti, NiCr alloys and NiFeCr alloys.

The top electrode stack 40 includes a fixed ferromagnetic layer 42, a pinning antiferromagnetic layer 44, and a cap or protective layer 46 formed on the antiferromagnetic layer 44. The ferromagnetic layer 42 is called the fixed layer because its magnetic moment is prevented from rotation in the presence of applied magnetic fields in the desired range of interest for the MTJ device. The fixed ferromagnetic layer may include two ferromagnetic layers sandwiching a non-magnetic metal layer including Ru, Re, Rh, Cu, Cr and the like. The magnetic moment of the free ferromagnetic layer 24 is not fixed, and is thus free to rotate in the presence of an applied magnetic field in the range of interest. The free ferromagnetic layer may include two ferromagnetic layers, the one ferromagnetic layer contiguous with the barrier including a high spin polarization material such as Co, alloys of Co, and alloys of NiFe. The other of the two ferromagnetic layers including one of NiFe and NiFeX (where X=Cr, Ta, Mo, Nb, Zr) alloys which have low magnetization and small coercive force.

Figure 1B:
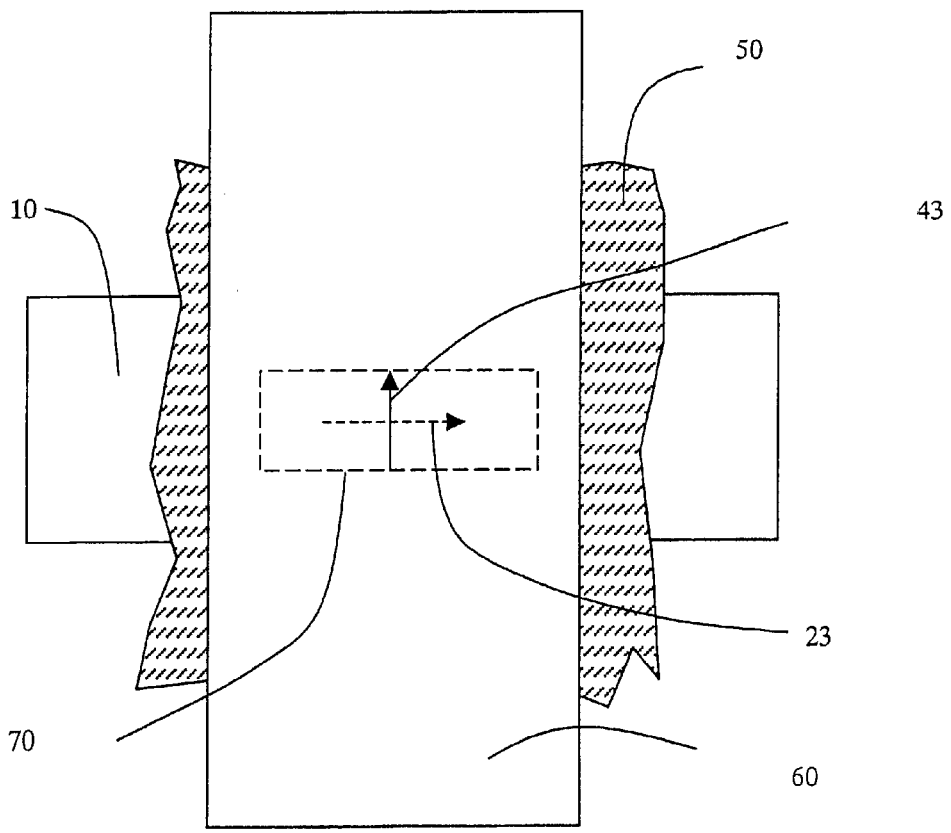

With reference to FIG. 1B and continuing reference to FIG. 1A, the magnetization direction 43 of the fixed ferromagnetic layer is aligned parallel to the external magnetic field. The magnetization direction 23 of the free layer is located perpendicular to the direction 43 of the magnetization of the fixed ferromagnetic layer without an external magnetic field.

A sense current I is directed from the top lead 60, perpendicularly through the protective layer 46, the antiferromagnetic layer 44, the fixed ferromagnetic layer 42, the tunneling barrier 30, the free ferromagnetic layer 24, the seed layer 22, and to bottom lead 10. The amount of tunneling current through the tunnel barrier 30 is a function of the relative orientations of the magnetizations of the fixed and free ferromagnetic layers 42, 24, which are adjacent to and in contact with the tunnel barrier layer 30.

The magnetic field from a recorded media, e.g., hard drive disk, at an air bearing surface (not shown) of the MTJ device causes the magnetization direction of the free ferromagnetic layer 24 to rotate away from the direction 23, i.e. into or out of the paper of FIG. 1A. This changes the relative orientation of the magnetic moments of the ferromagnetic layers 42, 24 and thus the amount of tunneling current, which is reflected as a change in electrical resistance of the MTJ. This change in resistance is detected by disk drive electronics (not shown) associated with the MTJ device and processed into data read from the disk.

Figure 1C:
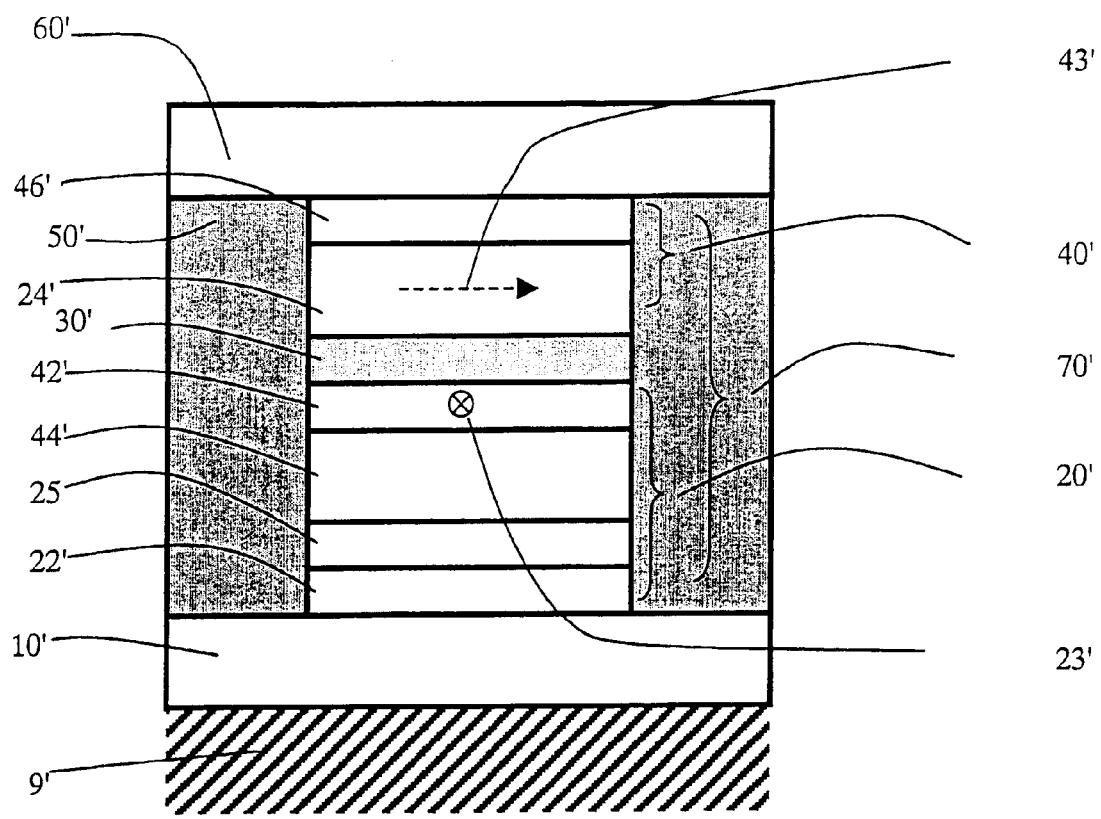
FIG. 1C shows a cross-sectional view of a MTJ device having a fixed ferromagnetic layer below a tunneling barrier of the present invention.

With reference to FIG. 1C, an alternate embodiment of the MTJ device has its fixed ferromagnetic layer below the tunneling barrier. Reference numerals of portions comparable with the reference numerals of portions of the previous embodiment are marked with a prime'. One additional layer, a template layer 25, is located between the seed layer 22' and the pinning layer 44'.

Figure 2A:
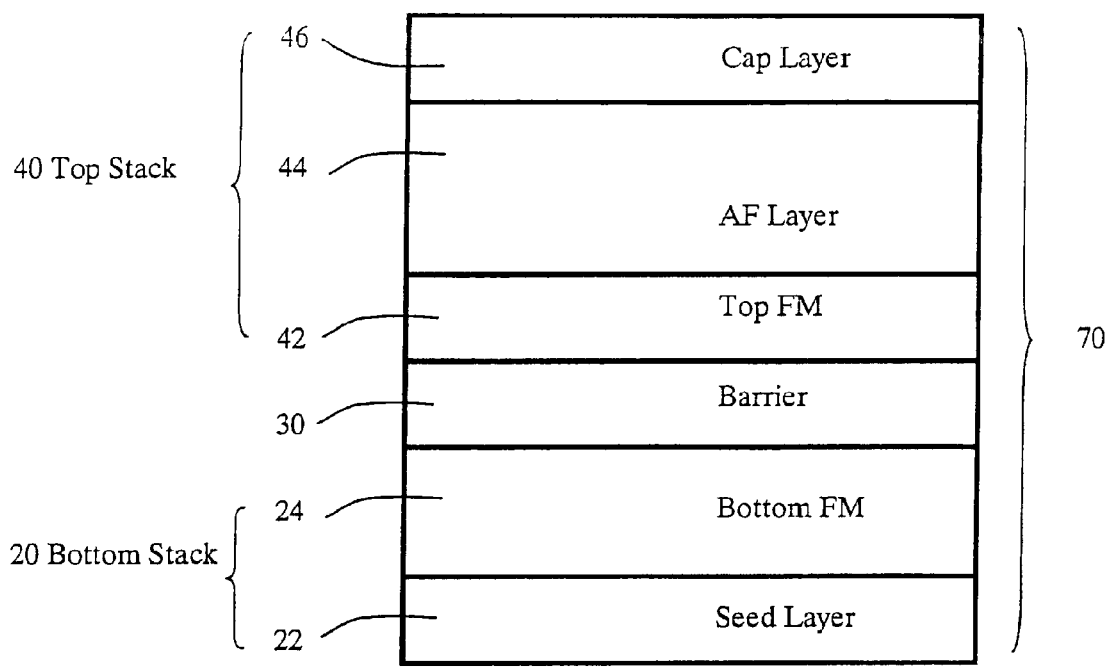
FIGS. 2A–2B are two schematic cross-sectional views of labeled layers of a MTJ with the fixed ferromagnetic layer on top of and below the tunneling barrier of the present invention, respectively.
Figure 2B:
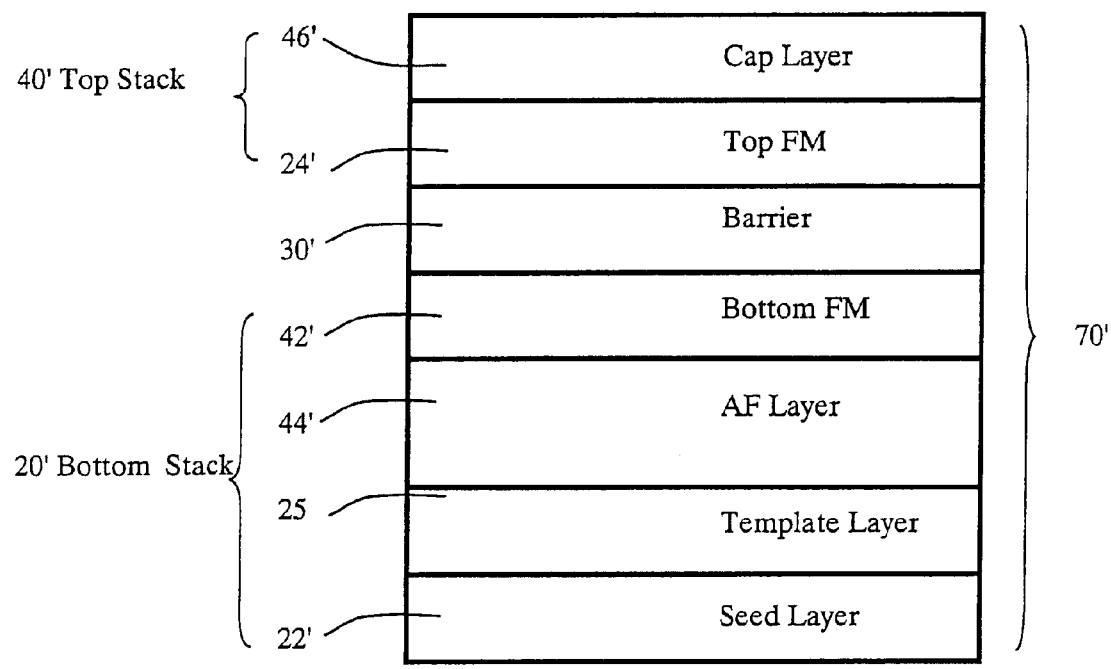

With reference to FIGS. 2A and 2B, the layers of the MTJs of the embodiments of FIGS. 1A and 1C, respectively, are labeled for clarity.

To increase TMR and improve the S/N ratio of the MTJ devices, it is preferable to, among other things, use a seed layer as shown above, and decrease the surface roughness of the base electrode. Further, the tunneling barrier may be formed by cryogenically depositing an Al or other material layer, warming the layer, and then plasma oxidizing the layer. The resistances of such junctions are in the range of hundreds of Ohms to tens of kΩ for junctions with cross-sectional areas of 200×300 $\mu m^2$.

To further improve the S/N ratio of the MTJ devices, the junction resistance is decreased by decreasing the tunneling barrier thickness. In this regard, a tunneling barrier is formed by oxidation of an Al layer. Alternatively, other metallic and non-metallic layers may be used which include one or more of Cr, Mo, Ta, Nb, Cu, Pt, Pd, B, C, Al, W, Si, Ti, V, Ru, Re, Zr, and Ga.

With reference to FIG. 3, a single layer, single oxidation barrier fabrication process often yields a barrier 30 that has widely varying thicknesses and is non-homogeneous, i.e., has varying concentrations of oxygen in a thickness direction. Such a barrier can have asymmetric electrical properties leading to problems discussed above.

In the present invention, multiple layers of Al are serially deposited and oxidized to form the tunneling barrier of MTJ devices. The processes result in more uniform barriers with improved smoothness or homogeneousness. The improved smoothness leads to an increase in the effective barrier thickness due to fewer pinholes and thus increases junction resistance and TMR.

With reference to FIG. 4, in one fabrication process, termed "Oxidation (I)", two metallic or non-metallic portions or layers are serially deposited and oxidized to form a barrier 30. The process is also termed a two-step oxidation process. In the two-step oxidation process, a first Al layer 32 is deposited on top of a first ferromagnetic layer 24 and oxidized to form an AlOx barrier layer. Then, a second Al layer 34 is deposited on top of the AlOx layer and it too is oxidized. The two oxidized layers form one homogeneous AlOx layer 30. Thereafter, a second ferromagnetic layer 42 is formed on the AlOx layer 30. It is to be understood by those skilled in the art that other metallic and non-metallic layers may be used in place of the Al layers discussed in this description. For example, the barrier layers may include one or more of Cr, Mo, Ta, Nb, Cu, Pt, Pd, B, C, Al, W, Si, Ti, V, Ru, Re, Zr, and Ga. More preferably, the barrier layers include one or more of Al, Ta, Ni, Ti, Hf, Mg, Si, Zr and Ga.

In one embodiment of two-step oxidation process, termed (I)-1, the thickness of the first metallic or non-metallic layer is preferably equal to or thinner than that of the second one. In another two-step oxidation process, termed (I)-2, the first metallic or non-metallic layer is thicker than the second one. Junctions formed by these processes show relatively low resistance and meanwhile keep relatively high TMR. Preferably, the first layer has a thickness less than or equal to 6 Å or in range of 1 to 6 Å, and the second layer has a thickness less than the first layer.

In a two-layer barrier of a given total tickness, a thickness of a first applied barrier layer being greater than a thickness of second applied barrier layer, i.e., oxidation process (I)-2, has empirically resulted in a barrier of lower resistance than if a thickness of the first layer was less or equal to a thickness of the second layer, i.e., oxidation process (I)-1. This indicates that the Al layer formed on AlOx has better growth than it does on a ferromagnetic electrode, leading to a barrier with better coverage and consequently fewer pinholes.

In additional embodiments, additional layers, i.e., third and fourth layers, may be added and oxidized to produce a homogeneous barrier. Preferably, first layer is thicker than all subsequent layers. Futher, preferably, the barrier is deposited on top of the free layer and the fixed layer is deposited on top of the barrier. In addition, it is preferable that the multilayer barrier has a thickness less than or equal to 15 Å.

In an example of an oxidation process of type (I)-2, a 5 Å thick multi-layer tunneling barrier or layer is created. First, a 3 Å thick Al layer is deposited in fabrication chamber. The chamber is pumped down. Then, the Al layer is exposed to pure oxygen or oxygen plasma to form an AlOx layer. A second 2 Å thick Al layer is then deposited on top of the AlOx layer. The chamber is again pumped down. The AlOx—Al layer is exposed to pure oxygen or oxygen plasma to form a two-layer AlOx—AlOx homogeneous layer.

Figure 5A:
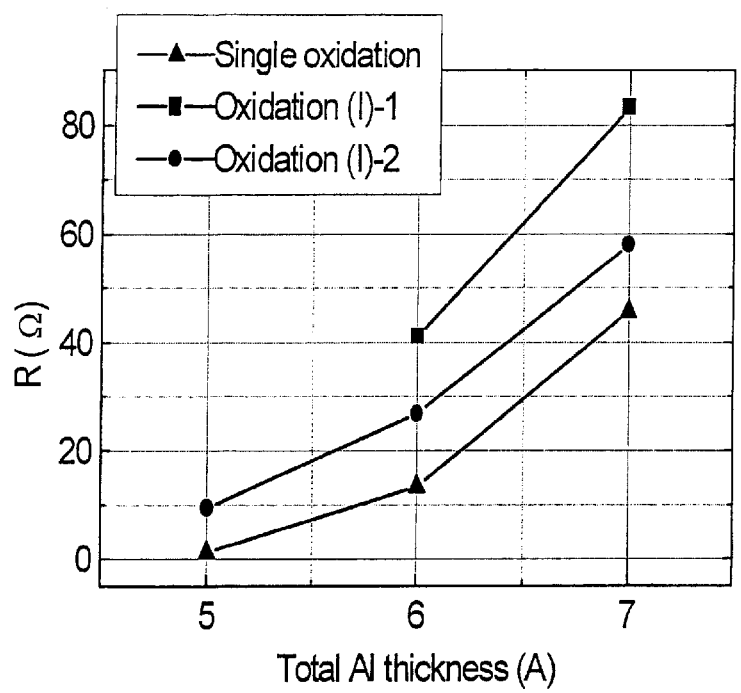
FIGS. 5A–B show the Al thickness dependence of junction resistance R and TMR, respectively, of MTJs with tunneling barriers formed by single and multiple oxidation processes.

With reference to the graph of FIG. 5A, for given oxidation conditions, the junction resistance R decreases with decreasing Al layer thickness. In this regard, a single Al layer of 7 Å that is deposited and subsequently oxidized (labeled "single oxidation") has a resistance of 44.5Ω. However, a single Al layer of 5 Å formed under the same conditions has a resistance of only 1.4Ω. Thus, one obeserves that decreasing barrier thickness decreases resistance.

Figure 5B:
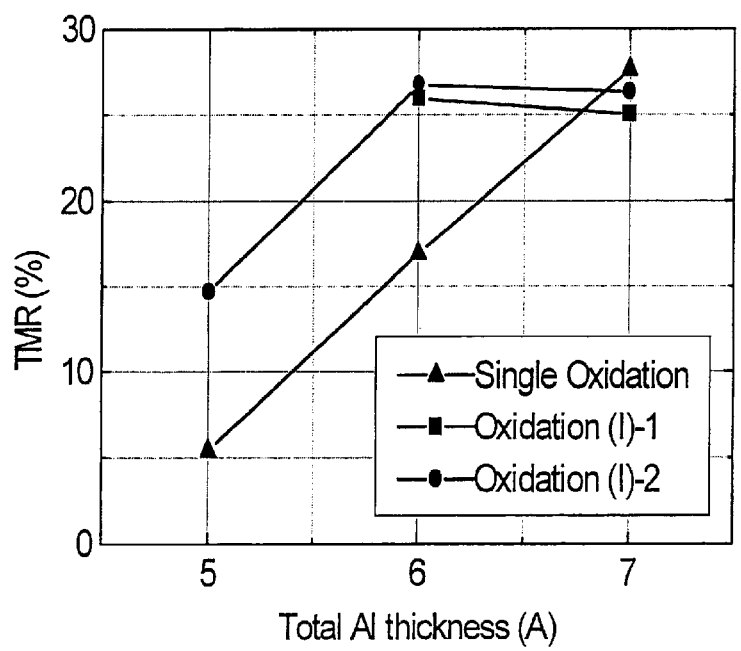

With reference to FIG. 5B, however, as the single Al layer decreases from 7 Å to 5 Å, the TMR correspondingly decreases from 27% to 5% (labeled "single oxidation"). This suggests that with a single layer, single oxidation barrier fabrication process, it is difficult to maintain a high TMR response when the Al layer is thin. This low TMR response obviously reduces the output and consequently S/N of the MTJ devices or read heads. The junctions studied in the graphs of FIGS. 5A and 5B have a layer structure of Ta50/NiFe50/CoFe20/AlOx/CoFe30/PtMn300/Ta (where thickness is in Å).

With reference to FIG. 5B, a junction formed by a single 5 Å thick Al layer subsequently oxidized (single oxidation) has a TMR of 5.4% and resistance of 1.3Ω. However, a junction formed by oxidation process (I)-2 has a TMR of 14.7% and resistance of 9.4Ω. This junction was formed by depositing and oxidizing a 3 Å thick Al layer, then depositing and oxidizing a 2 Å thick Al layer thereon. Thus, both TMR and junction resistance are increased by oxidation process (I)-2, especially for a thin Al layer. This suggests that the slight oxidation of bottom ferromagnetic surface during the first oxidation of 3 Å thick is not a serious problem compared with pinholes.

Figure 6A:
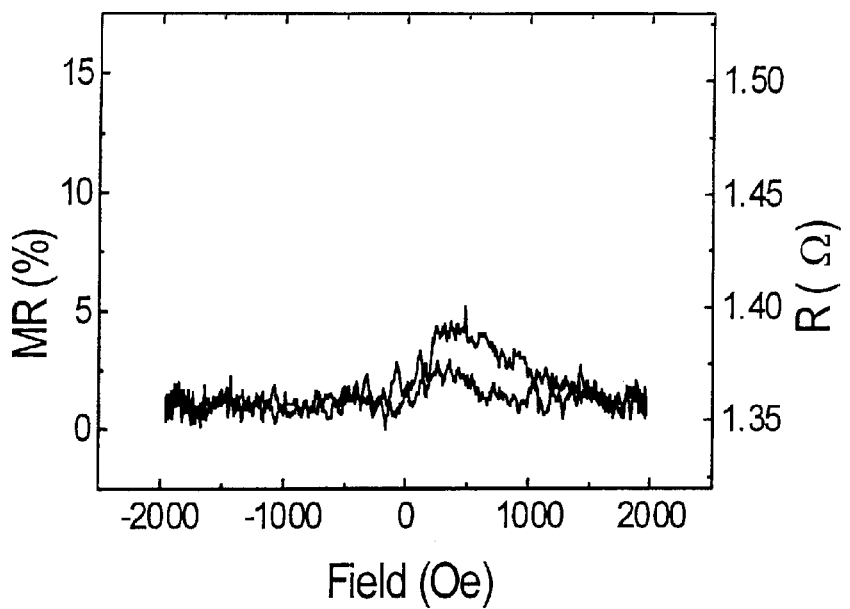
FIGS. 6A–B are comparative MR or TMR versus applied magnetic field response curves of a 1×1 $\mu m^2$ MTJ with a 5 Å thick barrier formed by a single oxidation method and a multiple oxidation method, respectively.
Figure 6B:
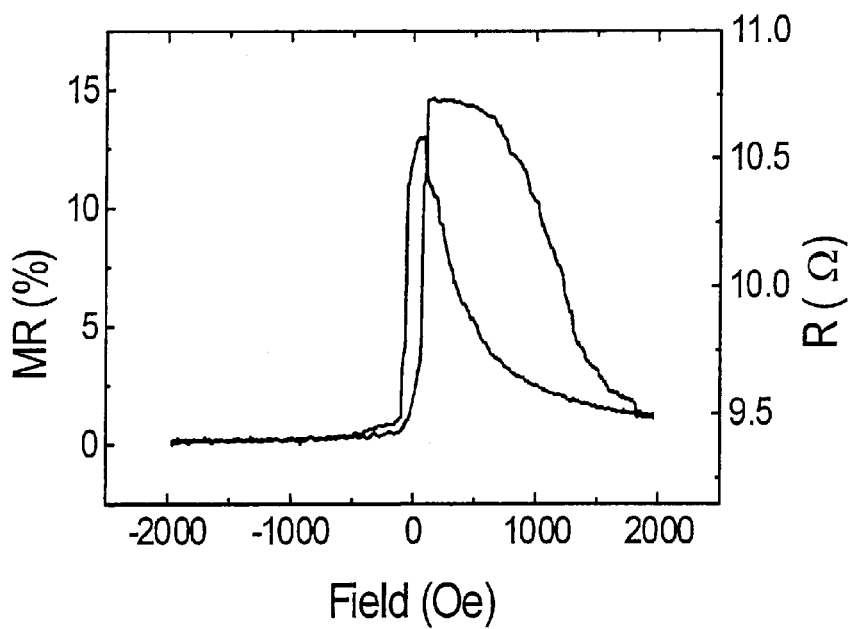

With reference to FIGS. 6A–B, the improved MR or TMR response is shown in comparative magnetic response curves (MR and R versus applied magnetic field) for 1×1 $\mu m^2$ MTJs having a 5 Å thick tunneling barrier. In FIG. 6A, the tested device has a tunneling barrier formed by singly oxidizing a 5 Å thick Al layer. In FIG. 6B, the device has a barrier formed by a first oxidation of a first 3 Å thick Al layer and a second oxidation of a 2 Å thick Al layer (oxidation process (I)-2).

Table 1 is a comparison of junctions with the tunneling barrier made by the single layer oxidation process and oxidation process (I) according to the present invention.

TABLE 1

| Oxidation | Al Å | Average RxA ($\Omega \mu m^2$) | a | 1 × 1 $\mu m^2$ TMR (%) | R (Ω) |
|---|---|---|---|---|---|
| two steps | 3 + 2 | 8.1 | 1.0051 | 14.7 | 9.4 |
| two steps | 3 + 3 | 37.1 | 0.9662 | 25.9 | 41.1 |
| two steps | 4 + 2 | 23.7 | 0.9869 | 26.7 | 26.9 |
| two steps | 3 + 4 | 78.4 | 0.9874 | 25 | 83.2 |
| two steps | 4 + 3 | 52.5 | 0.9844 | 26.3 | 57.9 |
| one step | 7 | 44.5 | 0.9928 | 27.6 | 45.7 |
| one step | 6 | 11.3 | 1.0056 | 16.9 | 13.3 |
| one step | 5 | 1.4 | 0.849 | 5.4 | 1.3 |

Figure 7A:
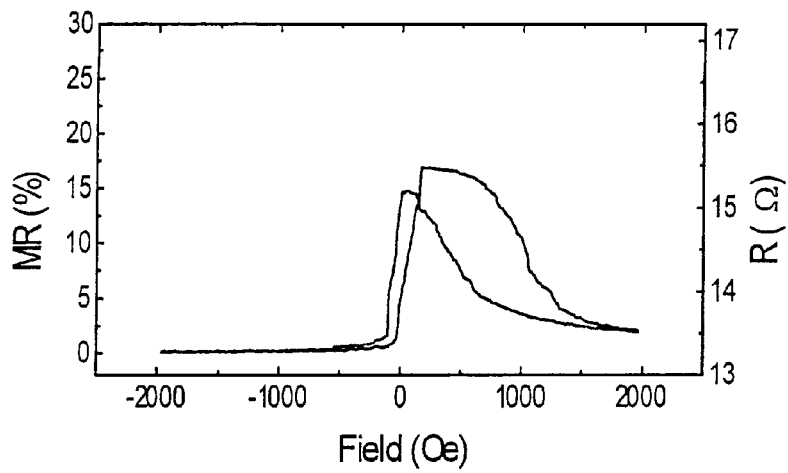
FIGS. 7A–C are comparative MR versus applied magnetic field response curves of 1×1 $\mu m^2$ MTJs with various 6 Å thick tunneling barriers formed by different oxidation processes.
Figure 7B:
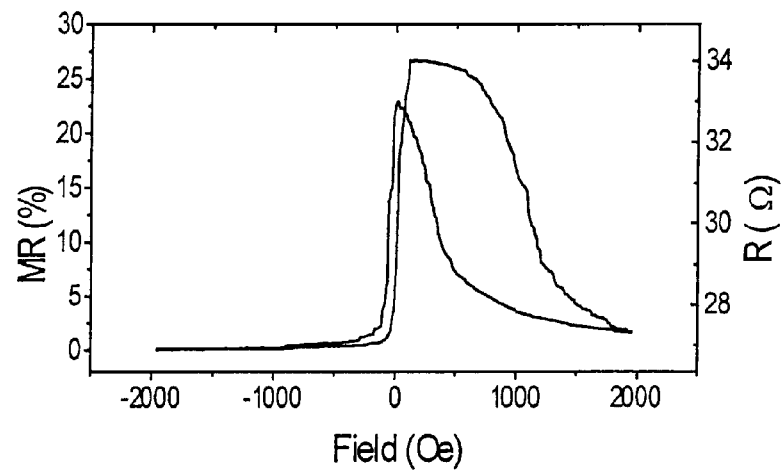
Figure 7C:
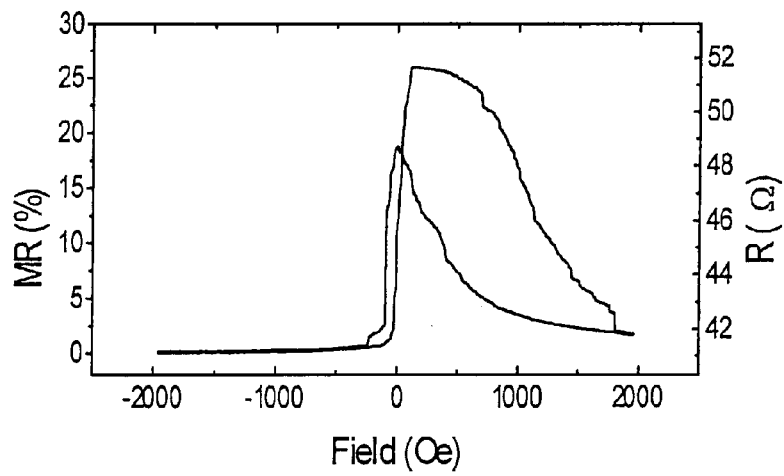

With reference to FIGS. 7A–C, different MR responses are shown in comparative magnetic response curves for 1×1 $\mu m^2$ MTJs having 6 Å thick barriers formed by different processes. FIG. 7A shows the response of a MTJ with a barrier formed by single oxidation of a 6 Å thick Al layer. FIG. 7B shows the response of a MTJ with a barrier formed by a first oxidation of a first 4 Å thick Al layer and a second oxidation of a 2 Å thick Al layer, i.e., oxidation (I)-2. FIG. 7C shows the response of a MTJ with a barrier formed by a first oxidation of a first 3 Å thick Al layer and a second oxidation of a second 3 Å thick Al layer, i.e., oxidation (I)-1.

Figure 8A:
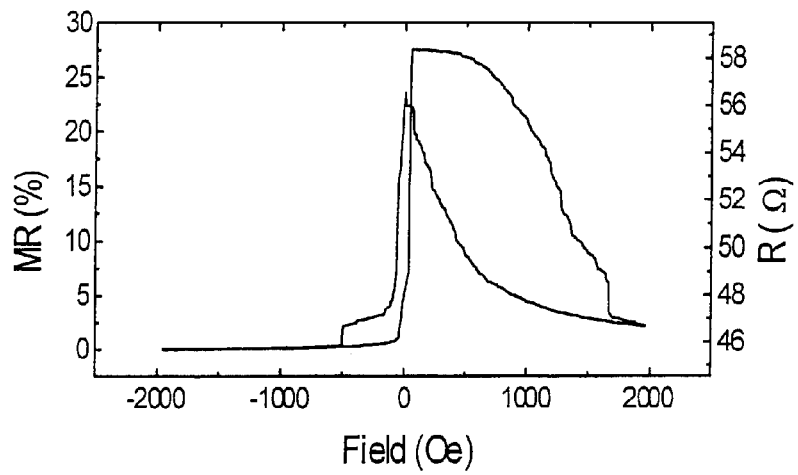
FIGS. 8A–C are MR versus applied magnetic field response curves of 1×1 $\mu m^2$ MTJs with various 7 Å thick tunneling barrier formed by multiple oxidations according to the present invention.
Figure 8B:
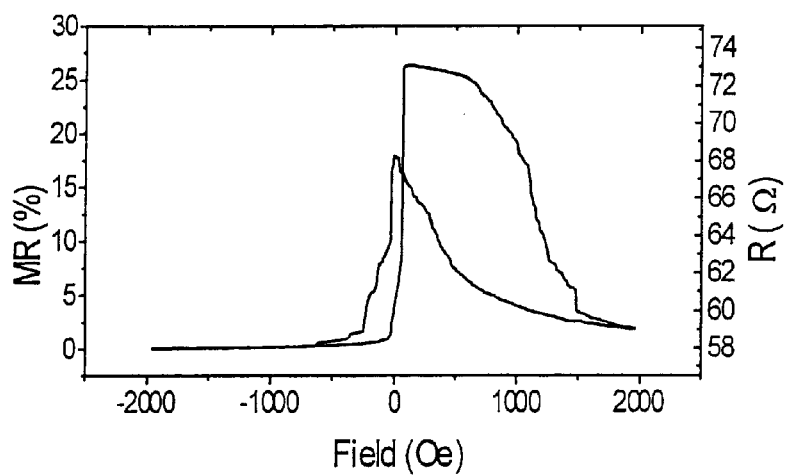
Figure 8C:
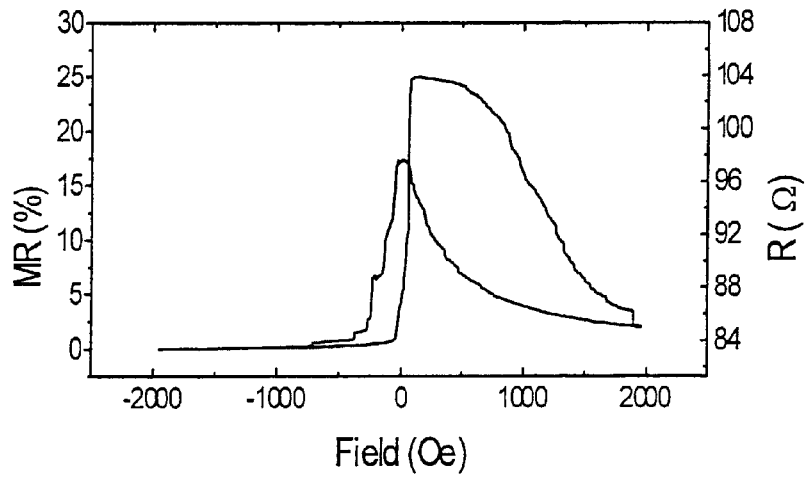

With reference to FIGS. 8A–C, different MR responses are shown in comparative magnetic response curves for 1×1 μm² MTJs having 7 Å thick barriers formed by different processes. FIG. 8A shows the response of a MTJ with a barrier formed by a single oxidation of a 7 Å thick Al layer. FIG. 8B shows the response of a MTJ with a barrier formed by a first oxidation of a first 4 Å thick Al layer and a second oxidation of a second 3 Å thick Al layer, i.e., oxidation (I)-2. FIG. 8C shows the response of a MTJ with a barrier formed by a first oxidation of a first 3 Å thick Al layer and a second oxidation of a second 4 Å thick Al layer, i.e., oxidation (I)-1. As indicated above, the junction has larger resistance when the first metal layer is thinner than the second one. See, for example, FIG. 6B and FIG. 6C. This indicates that the Al layer formed on AlOx has better growth than it does on a ferromagnetic (FM) electrode, leading to a barrier with better coverage and consequently fewer pinholes.

Figure 9:
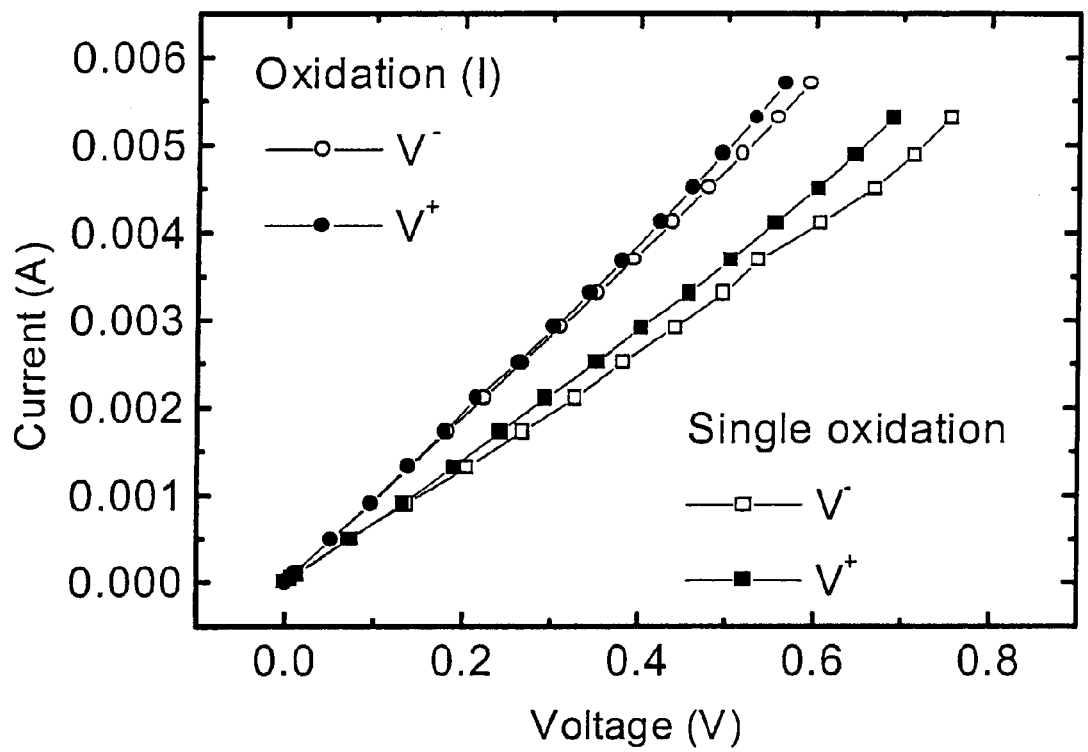
FIG. 9 shows the current-voltage characteristics of MTJs with tunneling barriers formed by single oxidation process and a multiple oxidation process (I).

With reference to FIG. 9, current voltage characteristics for junctions with $AlO_x$ barriers are better when the barrier is formed by oxidation process (I) than by a single oxidation process. In tests of the barriers, a positive bias is applied from top to bottom leads. Barriers formed by multiple oxidations shows more symmetric I–V curves, indicating more symmetric tunneling barriers.

Figure 10B:
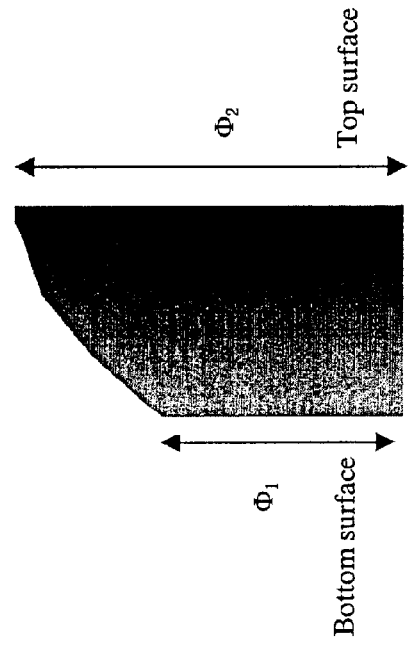
FIGS. 10A–B are schematic drawings of barrier height profiles of tunneling barriers formed by a single oxidation processes and by oxidation processes (I), respectively.
Figure 10A:
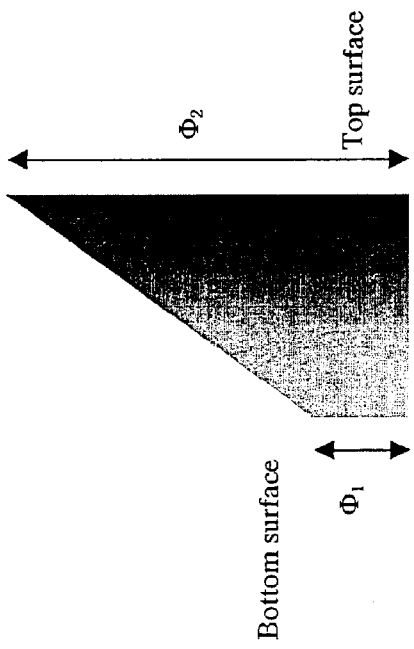

With reference to FIG. 10A, a tunnel barrier profile of a barrier formed by a single oxidation process is asymmetric. That is, a barrier height at a top surface of the barrier is significantly different from a barrier height at a bottom surface. The top and bottom surfaces interface with contiguous ferromagnetic layers in a MTJ. Asymmetric barriers are particularly associated with soft oxidation processes. The asymmetry is due to large oxygen atoms that are distributed in the top Al surface or upper portion of the Al barrier layer, which is more directly exposed to the oxygen atmosphere during oxidation.

With reference to FIG. 10B, a tunnel barrier profile of a barrier formed oxidation process (I) is more symmetric. The improved symmetry of the tunneling barrier is indicated by at more similar barrier height at the two interfaces of the ferromagnetic layers. After forming a first oxidized Al layer, adding a second Al layer and oxidizing it improves the symmetry due to inter-diffusion of the oxygen atoms during thermal annealing.

Figure 11A:
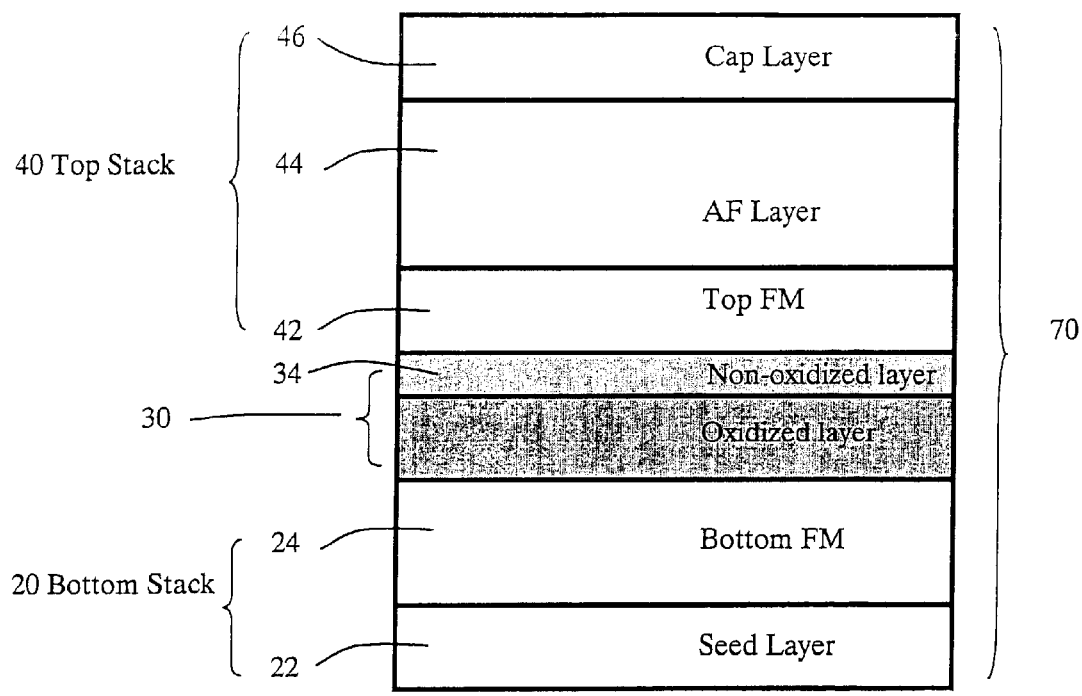
FIGS. 11A–B are two schematic representations of the layers making up a MTJ with a fixed ferromagnetic layer on top of and below the tunneling barrier, respectively, formed by an oxidation process (II) in which an Al layer is deposited on top of an oxidized Al layer, and thermally annealed.
Figure 11B:
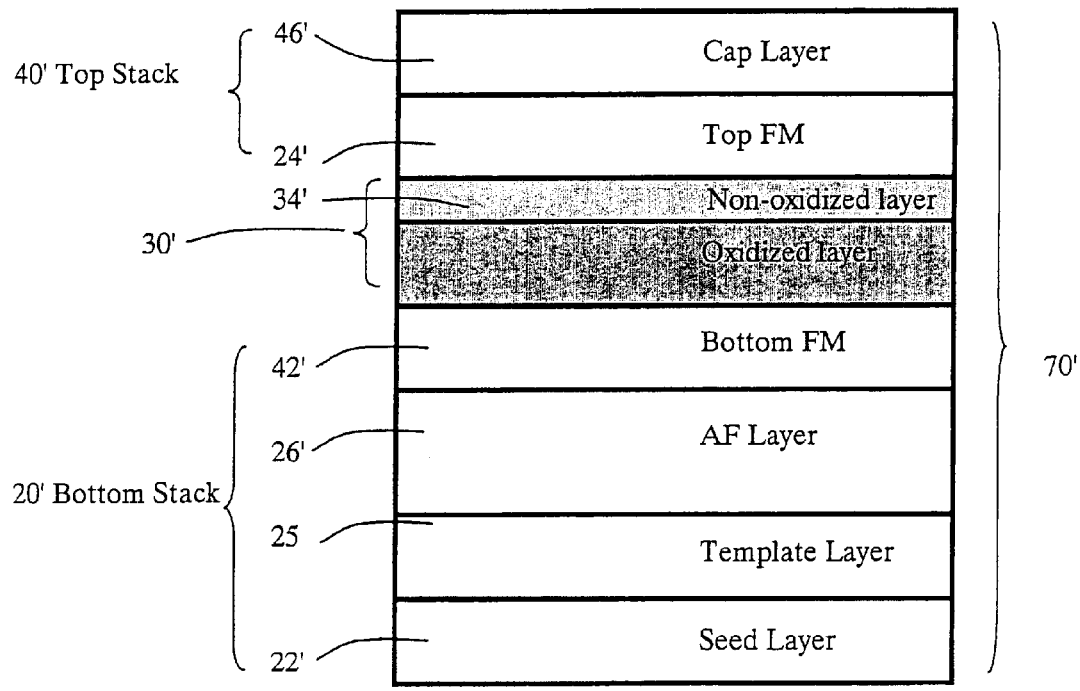

With reference to FIGS. 11A–B, in other preferred embodiments, an oxidation process (II) is used to create barriers in MTJs with a fixed ferromagnetic layer on top of or below the barrier, respectively. In oxidation process (II), a first metal or non-metal layer is deposited and oxidized. As with oxidation process (I), an embodiment in which the fixed barrier is on top of the free ferromagnetic layer is preferred. Then, a second metal or non-metal layer or cap layer is deposited onto the oxidized first layer. Preferably, the second layer has a thickness of less than or equal to 4 Å or in the range of 1 to 4 Å. The first and second layers may include one or more of Al, Ta, Ni, Ti, Hf, Mg, Si, Zr and Ga.

A top ferromagnetic electrode is then deposited onto the second layer. This electrode may be either a free or pinned layer. The multi layer film is annealed at a temperature preferably below 300° C. so that the second layer on top of the first oxidized layer is oxidized to form an insulating barrier due to inter-diffusion. Because the second layer is not heated in an oxygen environment, the layer remains largely non-oxidized. In alternative embodiments, additional layers may be deposited and oxidized before depositing the cap layer. Preferably, the first layer is thicker or equal to all subsequent layers, including the cap layer, of the barrier.

Figure 12A:
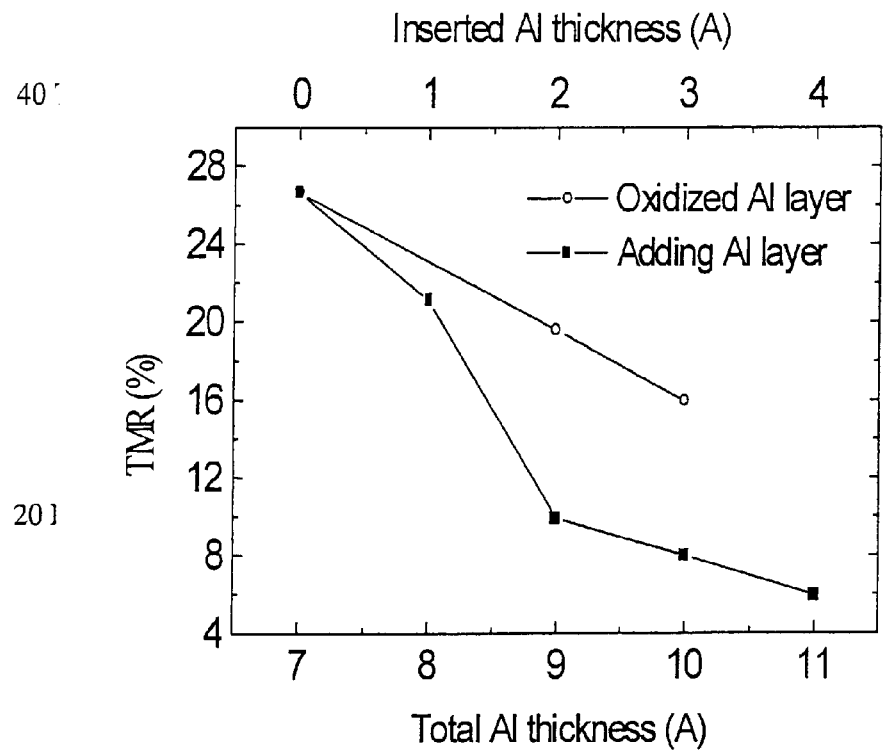
FIGS. 12A–B show the TMR and junction area resistance, respectively, as a function of the thickness of an added or inserted metal Al layer, which is deposited on top of an oxidized Al layer, and thermally annealed (oxidation process (II)).

With reference to FIG. 12A, barriers formed by oxidation process (II) exhibit similar TMR ratios to that of barriers formed by a single oxidation process. In this regard, an Al barrier formed by a single oxidation process exhibits a linearly decreasing TMR ratio as thickness increases from 7 to 10 Å. Adding an Al layer to a first oxidized Al layer, i.e., oxidation (II), results in similar TMR ratios with those of the single oxidation process over at least the total thickness range of 7 to 8 Å.

Figure 12B:
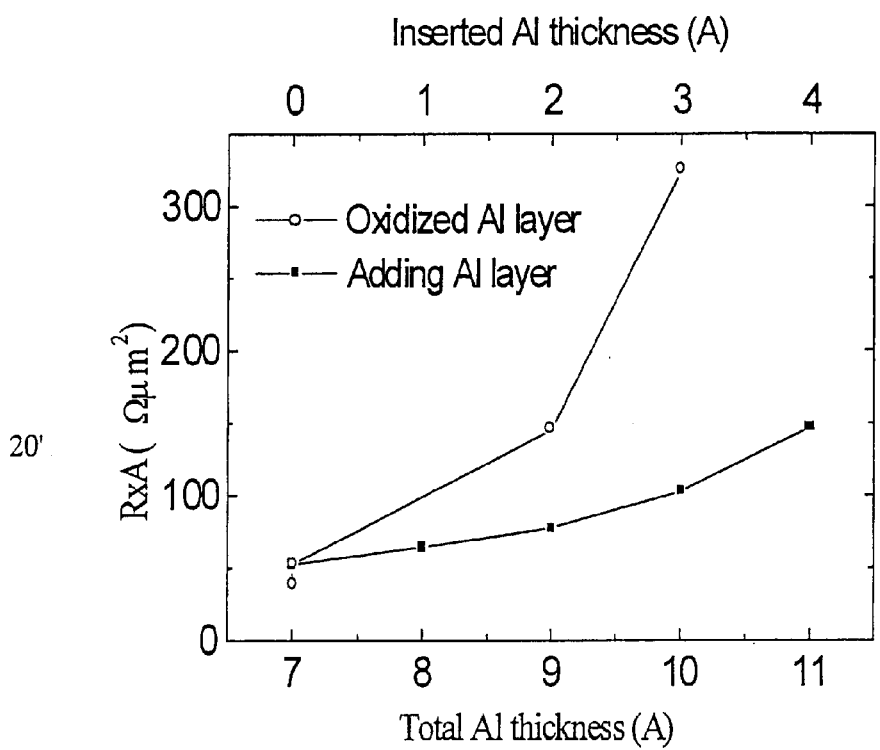

With reference to FIG. 12B, barriers formed by oxidation process (II) exhibit smaller resistance area products than that of barriers formed by a single oxidation process. In this regard, an Al barrier formed by a single oxidation process exhibits an increasing resistance area product as barrier thickness increases from 7 to 10 Å. Adding an Al layer to a first oxidized Al layer, i.e., oxidation (II), results in small resistance area products with those of the single oxidation process over at least the total thickness range of 7 to 9 Å. Thus, junctions formed by inserting a very thin Al layer show similar TMR but small resistance compared with single oxidation of an Al layer with the same total thickness.

The increased junction resistance indicates that the second Al layer is oxidized as shown in FIG. 12B. This inter-diffused oxidation process is very soft compared with single oxidation or limitation of oxygen content so that the resistance is smaller with oxidation process (II). This also leads to a large decrease of TMR in the large thickness of inserted Al layer on the top of the oxidized Al layer due to the metallic Al left in the interface barrier/FM.

Figure 13:
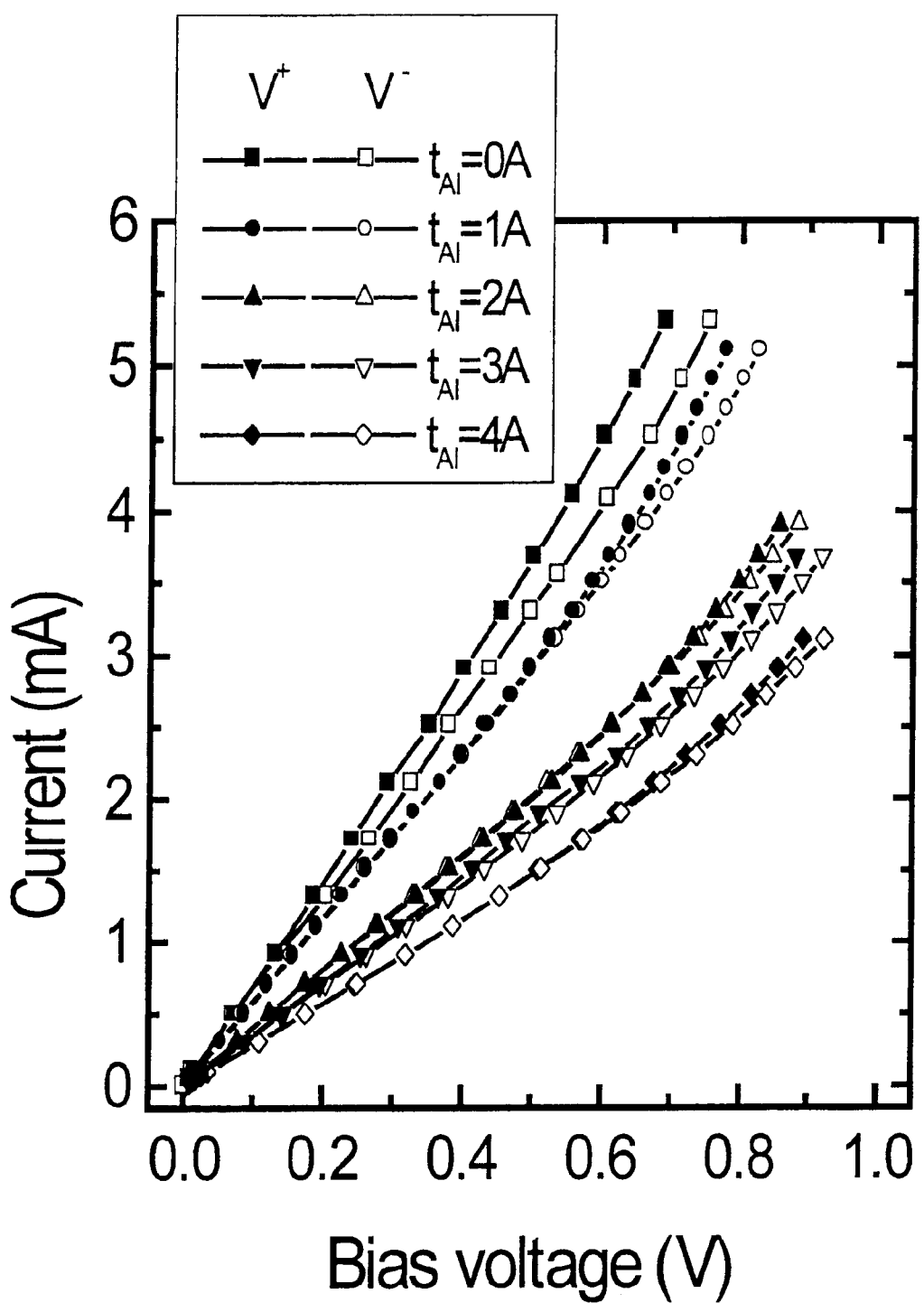
FIG. 13 shows the current-voltage characteristics of MTJs having barriers formed by adding a metal Al layer on top of an oxidized Al layer, then annealing at 250° C. for 5 hours, i.e., oxidation process (II).

With reference to FIG. 13, the current-voltage characteristics of MTJs with a metal Al layer inserted at the top of an oxidized Al layer after annealing at 250° C. for 5 hours, i.e., oxidation (II), indicates improved symmetry of tunneling barrier. In this regard, barrier symmetry improves as the thickness of the second Al layer is increased from 0, where 0 refers to no second layer. Preferably, annealing is done for a period of time less than or equal to 5 hours and at a temperature not equal to or higher than 300° C.

Figure 14:
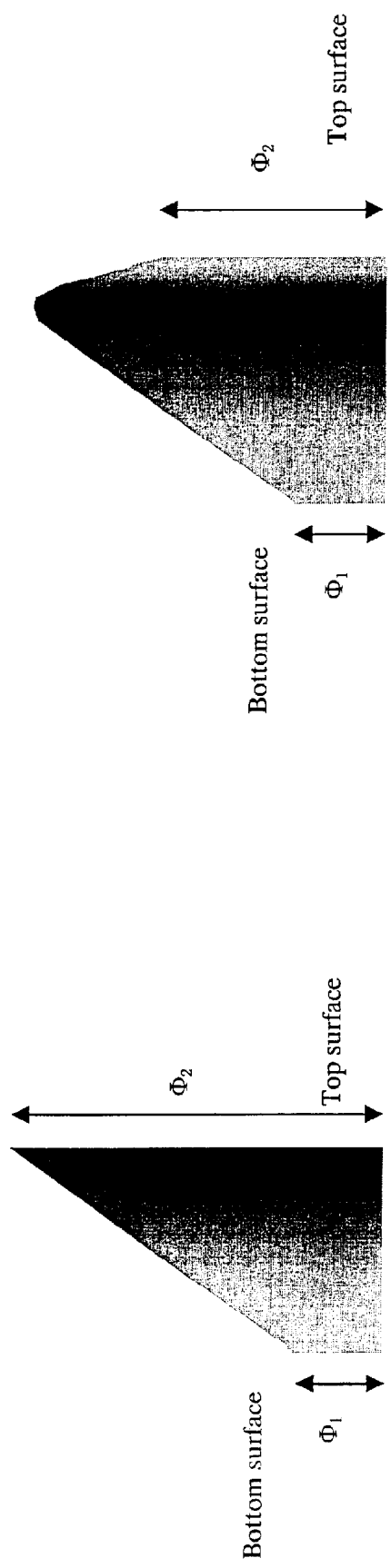
FIGS. 14A–B are comparative schematic drawings of barrier height profiles of tunneling barriers formed by a single oxidation processes and formed by annealing a non-oxidized cap layer on an oxidized layer, i.e., oxidation process (II), respectively.

With FIGS. 14A–B are schematic drawings of profiles of tunneling barriers formed by a conventional oxidation process and formed by annealing of oxidized layer capped by a non-oxidized layer, i.e., oxidation process (II), according to the present invention.

With reference to FIG. 14A, a tunnel barrier profile of a barrier formed by a single oxidation process is again shown to be asymmetric. With reference to FIG. 14B, a tunnel barrier profile of a barrier formed oxidation process (II) is by contrast more symmetric. The improved symmetry of the tunneling barrier is indicated by a more similar barrier height at the two interfaces of the ferromagnetic layers.

Figure 15:
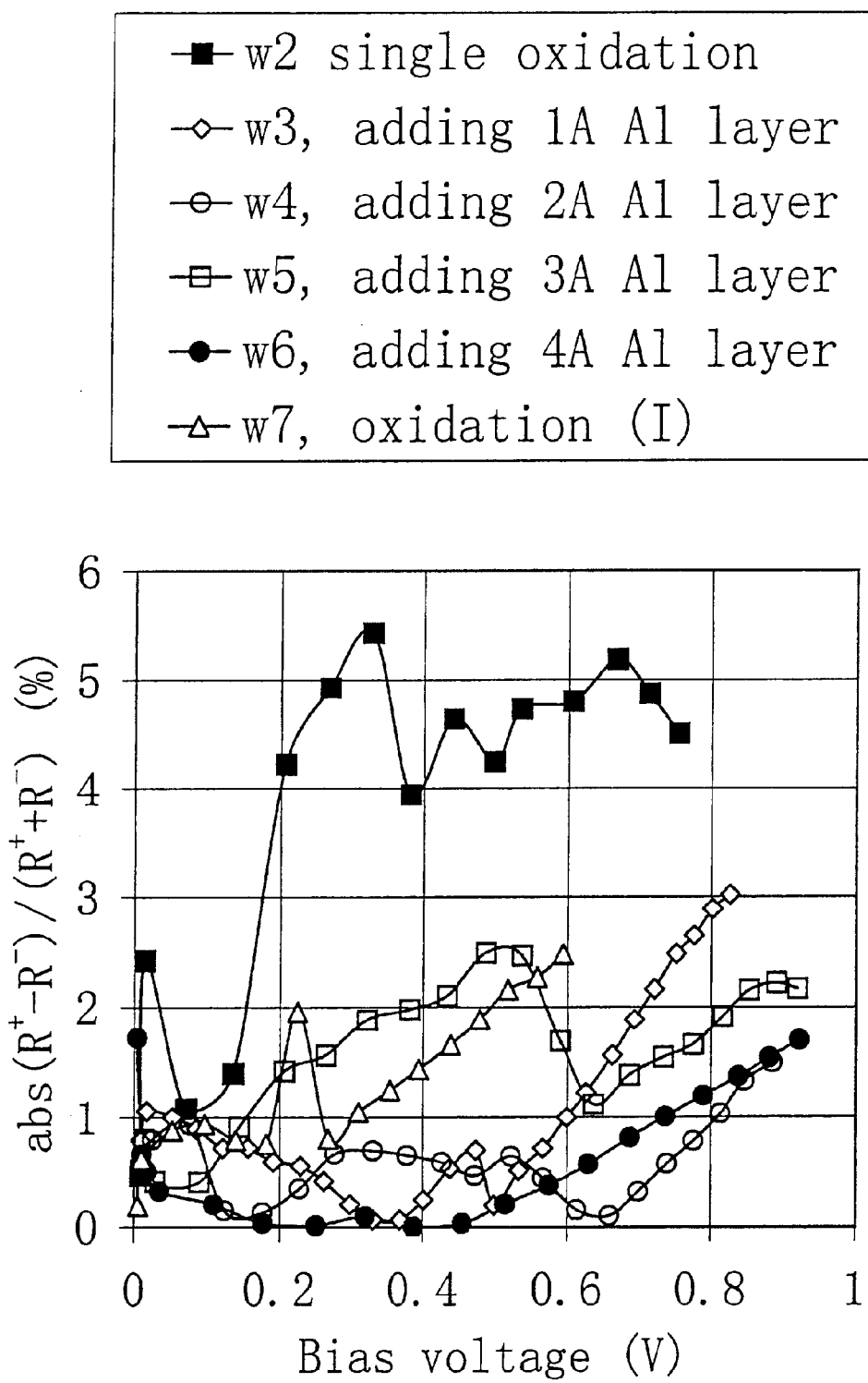
FIG. 15 is a graph of comparative the resistance differences [abs($R^+-R^-$)/($R^++R^-$)] as a function of applied bias for barriers formed by a conventional oxidation process and oxidation processes (I) and (II).

With reference to FIG. 15, barriers formed by oxidation processes (I) and (II) have improved resistance differences, i.e., $abs(R^+-R^-)/(R^++R^-)$ as a function of applied voltage bias, where $R^+$ is the resistance of the barrier for an applied bias and $R^-$ is the resistance of the barrier for an opposite applied bias. In barriers formed with oxidation processes (I) and oxidation processes (II), e.g., with added layers from 1–4 Å in thickness, the resistance difference with respect to the sign of applied voltage bias is much lower than in barriers formed by single oxidation processes. This indicates improved barrier symmetry in the devices formed with the oxidation processes (I) and (II). Preferably, the barriers are formed to have a resistance difference $[abs(R^+-R^-)/(R^++R^-)]$ with positive and negative biases of less than 3% in a bias range of 0–500 mV.

For additional disclosure of various aspect of the present invention, the following document is herein incorporated by reference:

U.S. Non-Provisional Patent Application Specification and Drawings filed on Jul. 20, 2000 (corresponding to U.S. Provisional Application No. 60/192,320, filed on Mar. 27, 2000), which application is entitled "Magnetic Tunnel Junction Read Head Using Hybrid, Low Magnetization Flux Guide" to Olivier Redon et al., which is directed to a read head design wherein the TMR ratio is maximized by choosing MTJ materials with the largest spin-polarization and wherein the flux guide efficiency is optimized using hybrid low-magnetization materials to achieve a large signal output.

The invention has been described with reference to the preferred embodiments. Obviously, modifications and alterations will occur to others upon reading and understanding this specification. It is intended that the invention be construed asincluding all such modifications and alterations insofar as they come within the scope of the claims or equivalents thereof.

What is claimed is:

1. A magnetic tunnel junction device for detecting an applied magnetic field comprising:

a first ferromagnetic layer;

a tunnel barrier on and contiguous with the first ferromagnetic layer, the barrier including an oxidized first barrier layer and a second barrier layer; and a second ferromagnetic layer on and contiguous with the barrier wherein the barrier has a resistance difference [abs($R^+ - R^-$)/($R^+ + R^-$)] with positive and negative voltage biases of less than 3% in a bias range of 0–500 mV.

2. The device of claim 1, wherein the second barrier layer is oxidized.

3. The device of claim 1, wherein a thickness of the first barrier layer is larger than or equal to a thickness of the second barrier layer.

4. The device of claim 1, further including one or more additional barrier layers on the second barrier layer.

5. The device of claim 4, wherein a thickness of the first barrier layer is larger than or equal to a thickness of each of the additional barrier layers.

6. The device of claim 1, wherein the first ferromagnetic layer is free layer.

7. The device of claim 1, wherein the first barrier layer has a thickness less than or equal to 6 Å.

8. The device of claim 1, wherein at least one of the first and second barrier layers includes one or more of Cr, Mo, Ta, Nb, Cu, Pt, Pd, B, C, Al, W, Si, Ti, V, Ru, Re, Zr, and Ga.

9. The device of claim 8, wherein at least one of the first and second barrier layers includes one or more of Al, Ta, Ni, Ti, Hf, Mg, Si, Zr and Ga.

10. The device of claim 1, wherein the second barrier layer is annealed.

11. The device of claim 1, wherein the second barrier layer has a thickness less than or equal to 4 Å.

12. The device of claim 1, wherein the barrier has a thickness less than or equal to 15 Å.

* * * * *